United States Patent
Salokatve et al.

(10) Patent No.: US 6,327,293 B1
(45) Date of Patent: Dec. 4, 2001

(54) OPTICALLY-PUMPED EXTERNAL-MIRROR VERTICAL-CAVITY SEMICONDUCTOR-LASER

(75) Inventors: Arto K. Salokatve, Tampere (FI); Juan L. A. Chilla, Sunnyvale, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 09/132,954

(22) Filed: Aug. 12, 1998

(51) Int. Cl.$^7$ ............................................. H01S 3/08

(52) U.S. Cl. ................................... 372/96; 372/70

(58) Field of Search ................ 372/45, 46, 96, 372/70, 50, 92, 93, 94, 95, 97, 98, 99, 100, 101, 102, 103, 104, 105, 106, 107, 108

(56) References Cited

U.S. PATENT DOCUMENTS

| | | | |
|---|---|---|---|
| 3,958,263 | * 5/1976 | Panish ..................... | 357/18 |
| 4,630,083 | * 12/1986 | Yamakoshi ............... | 357/17 |
| 5,131,002 | 7/1992 | Mooradian ............... | 372/50 |
| 5,289,485 | 2/1994 | Mooradian ............... | 372/45 |
| 5,321,253 | * 6/1994 | Gorfinkel ................. | 250/214 |
| 5,331,654 | * 7/1994 | Jewell ..................... | 372/45 |
| 5,349,596 | * 9/1994 | Molva ..................... | 372/43 |
| 5,432,809 | 7/1995 | Grodzinski et al. ...... | 372/45 |
| 5,446,754 | * 8/1995 | Jewell ..................... | 372/50 |
| 5,461,637 | 10/1995 | Mooradian et al. ...... | 372/92 |
| 5,519,529 | * 5/1996 | Ahearn .................... | 359/248 |
| 5,557,626 | * 9/1996 | Grodzinski ............... | 372/45 |
| 5,574,738 | * 11/1996 | Morgan .................... | 372/28 |
| 5,589,968 | * 12/1996 | May ......................... | 359/124 |
| 5,627,853 | 5/1997 | Mooradian et al. ...... | 372/92 |
| 5,673,284 | * 9/1997 | Congdon .................. | 372/50 |
| 5,991,318 | * 11/1999 | Caprara ................... | 372/22 |

(List continued on next page.)

FOREIGN PATENT DOCUMENTS

WO 95/25366   9/1995 (WO) ................ H01S/3/094

OTHER PUBLICATIONS

M. Kuznetsov, et al., "High–Power (>0.5–W CW) Diode–Pumped Vertical–External–Cavity Surface–Emitting Semiconductor Lasers with Circular TEM$_{00}$ Beams," *IEEE Photonics Technology Letters*, Vol. 9, No. 8, Aug. 1997, pp. 1063–1065.

Copy of Notification of Transmittal of the International Search Report, mailed Dec. 6, 1999, 7 pages in length.

M. Kuznetsov, et al., "High–Power (>0.5–W CW) Diode–Pumped Vertical–External–Cavity Surface–Emitting Semiconductor Lasers with Circular TEM$_{00}$ Beams," *IEEE Photonics Technology Letters*, vol. 9, No. 8, Aug. 1997, pp. 1063–1065.

J. V. Sandusky, et al., "A CW External–Cavity Surface–Emitting Laser," *IEEE Photonics Technology Letters*, vol. 8, No. 3, Mar. 1996, pp. 313–315.

A. Rosiewicz, et al., "Optical pumping improves VCSEL performance," *Laser Focus World*, Jun. 1997, pp. 133–136.

*Primary Examiner*—Teresa M. Arroyo
*Assistant Examiner*—Gioacchino Inzirillo
(74) *Attorney, Agent, or Firm*—Stallman & Pollock LLP

(57) ABSTRACT

A optically-pumped semiconductor (OPS), vertical-cavity, surface-emitting laser (VCSEL) includes a first mirror having a quantum-well structure thereon which provides a gain medium for the laser. A second mirror is spaced apart from the quantum-well structure and, together with the first mirror, forms a resonant cavity for the laser. Optical pump-radiation is directed through the gap into the quantum-well structure via an outermost layer of the quantum-well structure. The quantum-well structure includes a plurality of quantum-well layers spaced apart by pump-radiation absorbing layers. Quantum-well and pump-radiation absorbing layers are aluminum-free layers of alloys of the GaAs/InGaAsP system.

13 Claims, 3 Drawing Sheets

U.S. PATENT DOCUMENTS

| | | | |
|---|---|---|---|
| 5,991,319 | * | 11/1999 | Capara .................................... 372/22 |
| 6,026,108 | * | 2/2000 | Lim ........................................ 372/50 |
| 6,026,110 | * | 2/2000 | Makino ................................. 372/96 |
| 6,028,693 | * | 2/2000 | Fork ..................................... 359/248 |
| 6,061,381 | * | 5/2000 | Adams .................................. 372/96 |

* cited by examiner

US 6,327,293 B1

OPTICALLY-PUMPED EXTERNAL-MIRROR VERTICAL-CAVITY SEMICONDUCTOR-LASER

TECHNICAL FIELD OF THE INVENTION

The present invention relates in general to optically-pumped, semiconductor (OPS), vertical-cavity, surface-emitting lasers (VCSEL). The invention relates in particular to an OPS VCSEL having an aluminum-free quantum-well (QW) structure, an external cavity-mirror spaced-apart from the quantum-well structure, and an optical pump arrangement which directs pump-radiation into the quantum-well structure through the space between the external cavity mirror and the gain region.

DISCUSSION OF BACKGROUND ART

Compact and efficient lasers with a power output of 0.1 to 1.0 Watts (W) or greater, and having single-transverse-mode output beam have a wide range of applications. Such applications include optical communications, laser printing, and optical storage. These applications typically require beam propagation over a distance which is large compared to the size of the laser, focussing the output of the laser into a small spot, or coupling the output of the laser into a single-mode fiber. By way of example, Erbium-doped fiber amplifiers (EDFAs) used in optical communications systems require between about 0.1 W and 0.5 W of continuous-wave (CW) optical pump power in a single mode fiber.

Vertical-cavity surface-emitting semiconductor lasers inherently provide desired circular cross-section output beams. Small diameter VCSELs, for example, less than about 10 micrometers ($\mu$m) in diameter, operate in a single transverse mode, however, with an output power limited to less than about 10 milliwatts (mW). For larger devices, for example, greater than about 100 $\mu$m diameter, output power can be greater than about 100 mW, however, only in multiple transverse modes. Using an external cavity, i.e., a cavity which is provided by one mirror in contact with a semiconductor gain medium and another mirror spaced-apart from the semiconductor mirror and gain medium, a large diameter (about 120 $\mu$m) VCSEL has been forced to operate in a single transverse mode, however, at an output power of only about 2.4 mW.

The above comments regarding prior-art semiconductor lasers are devices which are electrically pumped, i.e., in which carriers are injected across electrical semiconductor junctions to recombine in active layers and thereby generate laser-radiation. In U.S. Pat. No. 5,461,637 to Mooradian and Kuznetsov, an OPS VCSEL operable in a single transverse mode is described. The laser includes a quantum-well structure which provides a gain region. The Mooradian and Kuznetsov patent teaches that an OPS VCSEL can be made to operate in a single transverse mode by separating cavity mirrors of the laser by a solid body which has a significant thermal coefficient of refractive index. The quantum-well structure also has a thermal coefficient of refractive index. Any absorbed pump-radiation which does not contribute to the gain process heats the quantum-well structure and the solid body adjacent thereto. This heating forms in effect a thermal lens in the body. The thermal lens forces the laser to operate in a single transverse mode. A significant drawback of devices described in the Mooradian and Kuznetsov patent is that pump-radiation must traverse one of the cavity mirrors, and, in one arrangement, the solid body also, in order to reach the gain structure. This, together with the thermal lensing effect, provides for difficulties in providing optics which efficiently match pump-radiation with the laser mode diameter at the quantum-well. Because of this, such lasers can be expected to have low optical efficiency.

Further, the VCSEL of Mooradian and Kusnetsov has a quantum-well region including spacer layers of AlGaAs. Because of this, it can be expected that the VCSEL would be subject to problems of limited lifetime similar to those which have been identified in edge-emitting diode-lasers using AlGaAs layers. There is clearly a need for an OPS VCSEL which can operate efficiently at a high power in a single transverse mode but which also has a long operating lifetime.

SUMMARY OF THE INVENTION

The present invention is directed to providing a vertical-cavity, surface-emitting laser system. In one aspect, a laser system on accordance with the present invention comprises a first mirror, and a semiconductor multilayer epitaxially-grown quantum-well structure on the first mirror. The quantum-well structure has an output-window layer defined as the epitaxially-grown layer furthest from the first mirror.

The quantum-well structure includes a plurality of quantum-well groups each thereof having a compressively stressed quantum-well layer of InGaAs and a spacer layer group and a barrier layer of GaAs between the spacer layer group the quantum-well layer. The spacer layer group includes one of a single layer of $In_xGa_{(1-x)}As_yP_{(1-y)}$ having a tensile stress, and a layer of GaAs and a tensile stressed layer of $GaAs_uP_{(1-u)}$.

A second mirror faces the output-window layer and is spaced apart therefrom, thereby defining a gap between the second mirror and the output-window layer. The first and second mirrors define a resonant cavity therebetween of length L.

The laser system includes at least one source of pump-radiation for optically pumping the quantum-well structure. The pump-radiation source is arranged to direct the pump-radiation into the quantum-well structure via the output-window layer thereof.

Preferably, the pump-radiation source is arranged to direct the pump-radiation through the gap between the second mirror and the output-window layer, without passing through said second mirror, then into the quantum-well structure via the output-window layer thereof.

In another aspect of the inventive laser system, the epitaxially-grown quantum-well structure is grown by molecular beam epitaxy. This growth method provides, among other advantages, more flexibility in selecting layer thickness and composition for pump-radiation absorption and stress control.

In yet another aspect of the present invention, layers of the quantum-well structure are aluminum-free. This forgoes the well known advantages of using the lattice matching to GaAs (low stress) properties materials of the AlGaAs system for building the thick structure of a VCSEL, in favor of aluminum-free materials of the InGaAsP system. These materials require significantly more effort in controlling stress for building a thick structure, but offer significant lifetime advantages over the AlGaAs system for lasers constructed therewith.

In one preferred embodiment of a laser in accordance with the present invention, the quantum-well layers are layers of compressively stressed $In_xGa_{(1-x)}As$; where $0.0 < x < 0.3$. Each spacer layer group is a single layer of $In_xGa_{(1-x)}As_yP_{(1-y)}$ having a composition selected to absorb the pump-radiation, and a stress-thickness product selected to balance the stress-thickness product of the quantum-well layer.

In another preferred embodiment of the present invention, the quantum-well layers are layers of compressively stressed $In_xGa_{(1-x)}As$, where $0.0<x<0.3$. Each spacer layer group includes a layer of GaAs and a layer of $GaAs_uP_{(1-u)}$. The GaAs layer absorbs the pump-radiation and the layer of $GaAs_uP_{(1-u)}$ has a composition selected such that it has a stress-thickness product selected to balance to balance the stress-thickness product of the quantum-well layer.

The laser, constructed using an uncoated chip and pumped by the output of a 2.0 W, 808 nm diode laser, has been operated at a power of more than 450 mW in the fundamental ($TEM_{00}$) mode. It is believed to be operable in the $TEM_{00}$ mode at a power of about 700 mW using an AR coated chip.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
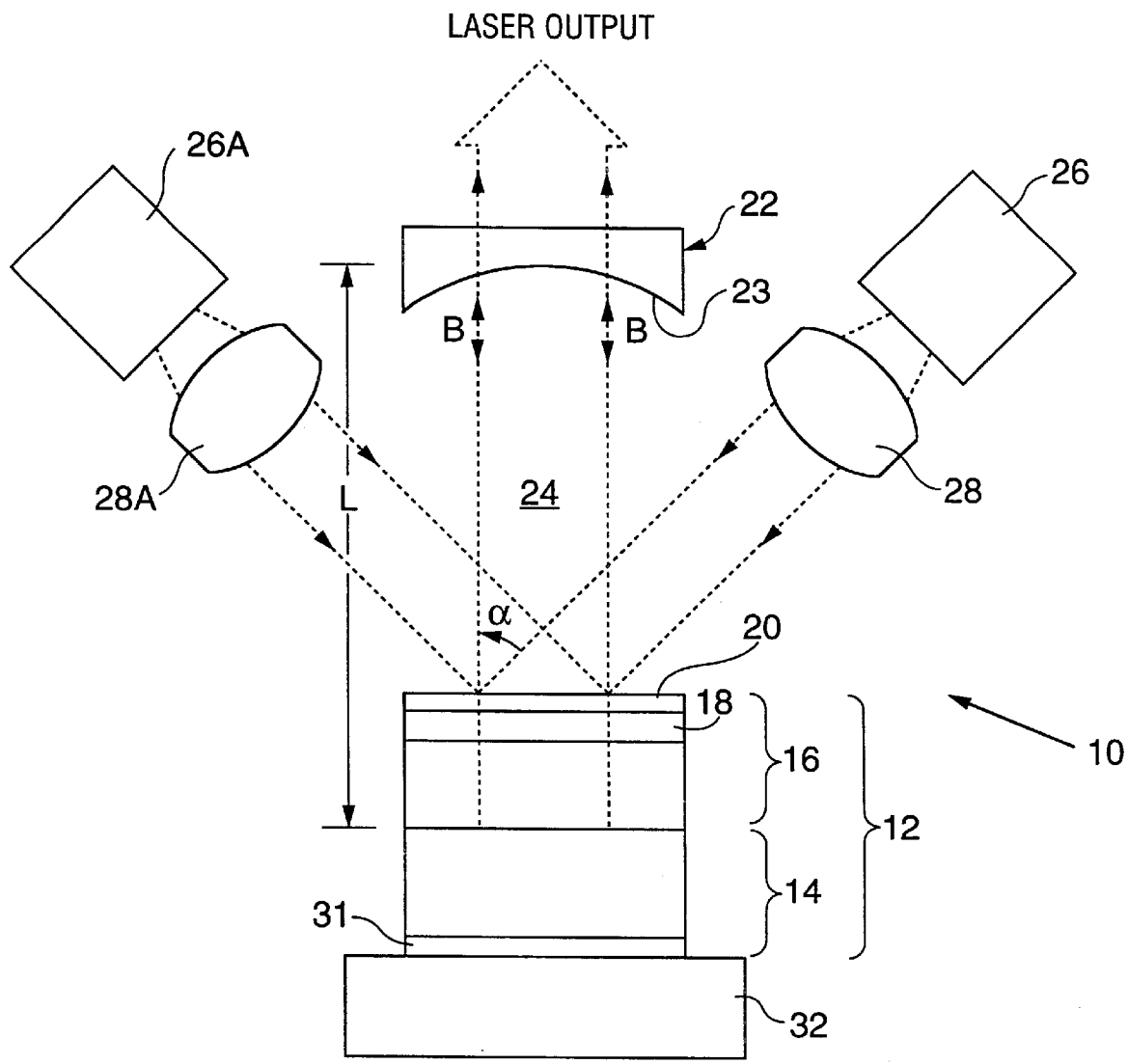
FIG. 1 is a general view, partly in cross-section, schematically illustrating a preferred embodiment of an optically-pumped vertical-cavity semiconductor laser in accordance with the present invention, including an epitaxially-grown semiconductor structure or chip having a multilayer mirror structure integrated with a multilayer quantum-well structure, and an external mirror forming a resonant cavity with the integrated semiconductor multilayer mirror.

Turning now to the drawings, wherein like components are designated by like reference numerals, FIG. 1 shows one preferred arrangement of a laser 10 in accordance with the present invention. Laser 10 includes a multilayer structure or chip 12. Chip 12 includes a mirror 14 integrated with an epitaxially-grown semiconductor multilayer quantum-well structure 16. Mirror 14 is preferably also an epitaxially-grown semiconductor multilayer structure, but may alternatively be formed from vacuum-deposited dielectric layers.

Quantum-well structure 16 provides a gain region for laser 10. An outermost, epitaxially-grown layer 18 of quantum-well structure 16 provides what may be defined as an output-window for the gain region, as far as laser-radiation generated in the gain region is concerned. For this reason at least, output-window layer 18 is preferably provided with an antireflection coating 20 which may include one or more layers. An external mirror 22 having a reflective surface 23, which is preferably a concave surface having a radius of curvature R, forms a laser resonant cavity having a physical length L measured from mirror 14 to mirror 22. Mirror 22 faces output-window layer 18 and is spaced apart therefrom, thereby defining a gap 24 between mirror 22 and output-window layer 18.

It should be noted here that the scale of chip 12 in FIG. 1 has been greatly exaggerated for ease of description. In a practical example, the combined thickness of layers in elements of chip 12 is only about a few micrometers, whereas cavity length L may be more than about ten millimeters. The values of R and L may be selected as is known in the art such that laser operates in a single transverse mode.

A source of pump-radiation 26 is provided. This is preferably a diode-laser. Pump-radiation from source 26 is directed through optics 28 to enter quantum-well structure (gain region) 16 through output-window layer 18 thereof as indicated by arrows A. Optics 28 is represented in FIG. 1 for simplicity as a single element. Those skilled in the art to which the present invention pertains, however, will recognize that optics 28 may comprise two or more separate elements, and that such elements may be cylindrical or aspheric elements and may even have a gradient refractive index.

Laser-radiation generated in quantum-well structure 16 resonates in cavity 24 in a general direction illustrated by arrows B. Pump-radiation A is incident on output-window layer at an angle α to this general direction of laser-radiation, i.e., to a direction optically normal with respect to layer 18.

One or more additional sources of pump-radiation and focussing optics, for example source 26A and associated optics 28A may be provided to increase pump-power delivered to quantum-well structure 16. Such additional sources are preferably arranged radially about the resonant cavity and pump light to a common area, matched to the laser-mode diameter d, on quantum-well structure 16.

Mirror 14 is made maximally reflective (meaning no significant transmission of laser-radiation is contemplated) for laser-radiation B. External mirror 22 is provided on surface 23 thereof with a coating (not shown) which is partially reflective and partially transmissive for laser-radiation B. The bulk of mirror 22 is transparent to laser-radiation B. Accordingly, that portion of light transmitted through surface 23 provides output laser-radiation as illustrated in FIG. 1.

By not directing pump-radiation through mirror 22, the mirror is not included in the overall optical train for focussing pump-radiation. Including the mirror in such an overall train could preclude optimally providing focussing of pump-radiation. Further, loss of pump-radiation due to reflection or absorption in the coating of surface 23 or the substrate of mirror 22 is avoided.

In order to maintain the laser at a constant operating temperature, chip 12 is bonded via a bonding layer 31, to a heat sink 32. Bonding layer 31 is preferably formed from a high thermal conductivity material to ensure optimum thermal communication between chip 12 and heat-sink 32.

In VCSELs, the semiconductor structure typically includes about one-hundred layers. Accordingly, it is necessary to control stress in the layers such that it does not increase to a point where the integrity of the layer is compromised. In prior-art VCSEL's for operation at about 976 nm, it is usual to employ GaAs/AlGaAs layers grown by metalorganic chemical vapor deposition (MOCVD) for both mirror and quantum-well structures.

GaAs/AlGaAs layers are used in these prior art VCSEL's because materials in this system can be relatively closely lattice matched to GaAs over a wide range of composition, thereby providing for simplicity of stress control in layers of the semiconductor structure for a wide range of emission wavelengths. MOCVD has been the deposition method of choice for layer growth in all types of prior-art semiconductor lasers, primarily for a believed advantageous rate of layer growth and simplicity of equipment, handling and containment problems of toxic MOCVD precursor materials aside.

While aluminum-containing layers have been identified with long term degradation problems in edge-emitting (electrically pumped) diode-lasers, due, for example, to phenomena associated with oxidation of the aluminum component of the layers or so-called dark defects, aluminum-containing layers have not been identified as problematical in (OPS) VCSELs. Prior-art VCSELs have generally been employed as low power devices which are not subject to radiation induced reaction and generation of dark defects. The inventive OPS VCSEL is a high-power device, accordingly avoiding dark defects is important.

In optically-pumped vertical-cavity semiconductor lasers in accordance with the present invention, layers of the quantum-well structure are formed from III–V alloys of the general composition $In_xGa_{(1-x)}As_yP_{(1-y)}$. For purposes of this description it is assumed that: x can be 0.0 and y equal to 1.0 (i.e, GaAs); y can be zero and x non-zero (i.e., $In_xGa_{(1-x)}P$; y can be 1.0 and x non-zero (i.e., $In_xGa_{(1-x)}As$); and x can be zero and y non-zero (i.e, $GaAs_yP_{(1-y)}$). Interchangeably, ternary and quaternary examples of the alloy system are written without suffices, for example InGaAsP or GaAsP, and composition implied by a desired stress (lattice constant) or wavelength (bandgap).

The use of the GaAs/AlGaAs system for mirror layers is retained. For this purpose the Al content of layers is not deemed problematical.

Mirror layers and layers of quantum-well structures in the inventive VCSEL's are deposited by molecular beam epitaxy (MBE). This method has been found particularly advantageous for forming InGaAsP materials, as the relatively low substrate temperature (compared to MOCVD) permits growth of compositions which would be precluded in MOCVD due to phase separation. This, as described further below, has been found advantageous in layer stress control.

Figure 2:
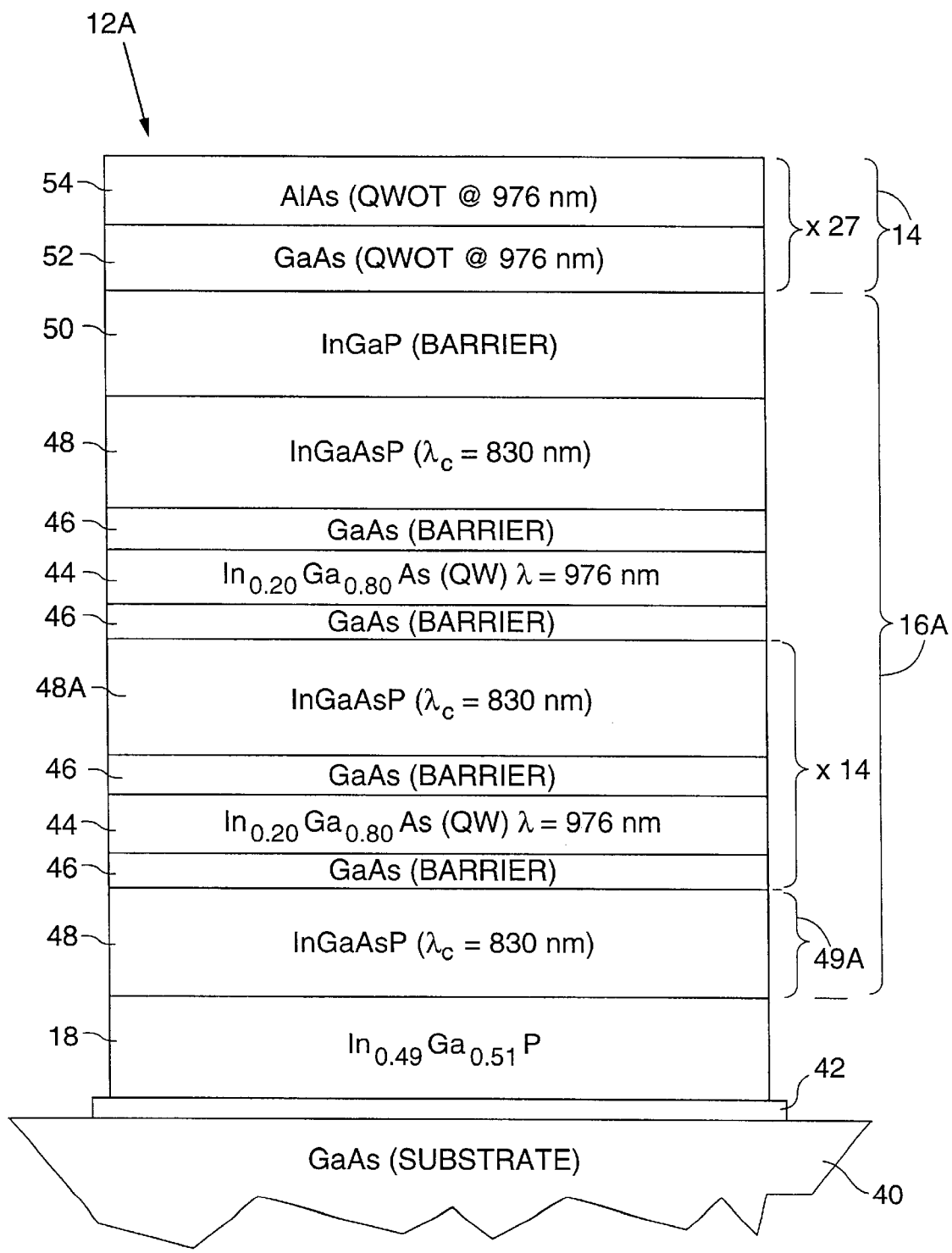
FIG. 2 is a general cross-section view illustrating details of one example of the mirror and quantum-well structures of FIG. 1.

Referring now to FIG. 2, exemplary construction details in one preferred embodiment 12A of chip 12 of laser 10 are illustrated. This preferred embodiment, is designed to be pumped by radiation having a wavelength of about 808 nm and provide laser emission at a wavelength of 976 nm. Semiconductor layers of mirror 14 and a quantum-well structure 16A are grown on a GaAs substrate (wafer) 40 having a buffer-layer 42 grown thereon for promoting epitaxy. For purposes of this description, buffer-layer 42 can be considered part of the substrate.

Quantum-well structure 16 is first grown, beginning with output-window layer 18 thereof. Output-window layer 18 is a layer of $In_{0.49}Ga_{0.51}P$ having an optical thickness of about $\lambda_e/2$ where $\lambda_e$ is a wavelength of 976 nm. This layer serves as an electrical confinement layer for preventing migration of carriers to the surface of chip 12, and also serves as an etch stop for later removal of substrate 40 by etching. If a thicker layer is preferred for electrical confinement purposes it should be an integer multiple of $\lambda_e/2$ in optical thickness. Next a spacer layer 48 is grown. Layer 48 of InGaAsP having a composition $In_{0.08}Ga_{0.92}As_{0.82}P_{0.18}$ providing a cut-on wavelength ($\lambda_c$) of about 830 nm for optimally absorbing pump-radiation at a wavelength of 808 nm Next, fourteen groups of four layers are grown, each group including: a quantum-well layer 44 of $In_{0.20}Ga_{0.80}As$, having a thickness of about 7.0 nm and which is compressively stressed; two unstressed barrier layers 46 of GaAs having a thickness of about 5.0 nm; and a layer 48A of InGaAsP having a composition $In_{0.08}Ga_{0.92}As_{0.82}P_{0.18}$ providing a cut-on wavelength ($\lambda_c$) of about 830 nm. Layers each 48 and 48A have a tensile stress-thickness product which about compensates the compressive stress-thickness product of quantum-well layer 44, thereby providing a net stress of about zero for the group of layers. Quantum-well structure 16 is completed by another quantum-well layer 44, grown between barrier layers 46, a final spacer layer 48 of InGaAsP having a composition $In_{0.08}Ga_{0.92}As_{0.82}P_{0.18}$, and a barrier layer 50 of an $In_{0.49}Ga_{0.51}P$ composition.

Quantum-well structure 16 can be described functionally as including a plurality of quantum-well layers having pump-radiation-absorbing layers between successive ones thereof. The number of quantum-wells is not limited to the fifteen exemplified above or any other number. Preferably, however, at least ten should be included.

Those skilled in the art to which the present invention pertains will recognize that pump-radiation absorbed in layers 50 generates electrical carriers which "fall" into quantum-well layers 48, creating a massive concentration of these electrical carriers in the quantum-well layers. Carrier recombination in the quantum-well layers generates the laser-radiation. The arrangement of quantum-well structure 16 described above provides that quantum-well layers 44 thereof are located about at antinode positions of an optical standing-wave which exists in cavity 24 when laser action is current.

It should be noted here that, for the purposes of this description and the appended claims, quantum-well layers are not limited to very thin layers, for example 7 nm or less, but may have varying degrees of thickness that will provide a sufficient measure if carrier concentration to provide optical gain.

In a more general description of quantum-well structure 16, quantum-well layers are layers of a compound $In_xGa_{(1-x)}As$ where $0.0<x<1.0$. Pump-light absorbing layers 50 are layers of a compound $In_xGa_{(1-x)}As_yP_{(1-y)}$, where $0.0 \leq x<1.0$ and $0.0<y \leq 1.0$.

It should be noted, however, that discouragement of carrier migration can be a function of some other layer than above exemplified layer 18. Accordingly, the output-window layer of quantum-well structure 16 may be more generally defined as being the epitaxially-grown layer of the quantum-well structure furthest from mirror 14.

Continuing now with reference to FIG. 2, after quantum-well structure 16 is grown, mirror 14 is grown. Mirror 14 is formed by growing successively twenty-seven groups of two layers. Each group includes a layer 52 of GaAs and a layer 54 of AlAs. Layers 52 and 54 each have a one-quarter wavelength optical thickness (QWOT) at 976 nm. Those skilled in the art to which the present invention pertains will recognize mirror structure 14 as being a multilayer interference mirror of a general type represented by a formula $$(HL)^n \tag{1}$$

where n is an integer often referred to as a group repetition number and is not limited to the number twenty-seven exemplified above. H and L represent quarter wave optical thickness layers, layers H (layers 52) having a higher refractive index than layers L (Layers 54). Assuming layers H and L are essentially non absorbing, reflectivity of such a mirror is determined by the magnitude of n and the difference in refractive index between an H layer and an L layer. Mirror 14, as exemplified above, provides a reflectivity of about 99.9% at a wavelength of about 976 nm. It should be noted here that layers 54 are layers of a compound in a general system $Al_pGa_{(1-p)}As$, where $0.0<p<=1.0$, wherein refractive index is increased by increasing p.

Layer thicknesses in quantum-well structure 16 are preferably selected such that each quantum-well layer is at the antinode of a standing-wave generated in the structure when laser 10 is operational. This can be arranged by providing that layer 50 has an optical thickness of $\lambda_e/2$; layers 48 have an optical thickness of $\lambda_e/2$ minus half the total optical thickness at $\lambda_e$ of a quantum-well layer 44 and its surrounding barrier layers 46; and layers 48A each have an optical thickness of $\lambda_e/2$ minus the total optical thickness at $\lambda_e$ of a quantum-well layer 44 and its surrounding barrier layers 46. Alternatively, if layers 18 and 50 each have an optical thickness of $\lambda_e/2$ plus half the total optical thickness at $\lambda_e$ of a quantum-well layer 44, layers 48 will have the same thickness as layers 48A.

After the quantum-well and mirror structures 16 and 14 have been grown as described above, a metallization layer (not shown) is deposited on the outermost layer of mirror structure 14. The GaAs substrate is then thinned, by abrasion, to a thickness of about 40 $\mu$m and cleaved into chips of about 500×500 $\mu$m. The thinning process can be omitted if a an initially thin GaAs substrate such as a 120.0 $\mu$m thick EpiReady™ substrate obtainable from AXT corporation.

After cleaving, any one of these chips can be used to provide chip 12 of laser 10. This is done by soldering one of the cleaved chips (see bonding layer 30 FIG. 1) to a diamond heat-sink (heat-sink 32 of FIG. 1) and then removing the substrate 40 (and buffer layer 42 thereon) by selective chemical etching using output-window layer 18 as an etch stop. The substrate may be removed entirely, or by etching an aperture in the substrate wide enough to accommodate the laser operating-mode (mode-spot) diameter. After the substrate is removed, antireflection coating 20 is deposited on exposed output-window layer 18. As noted above, coating 20 may be formed simply from a single dielectric layer, or from multiple dielectric layers. The coating is preferably designed to reduce reflection at both the wavelength of laser light output and the wavelength of the pump-radiation.

Figure 3:
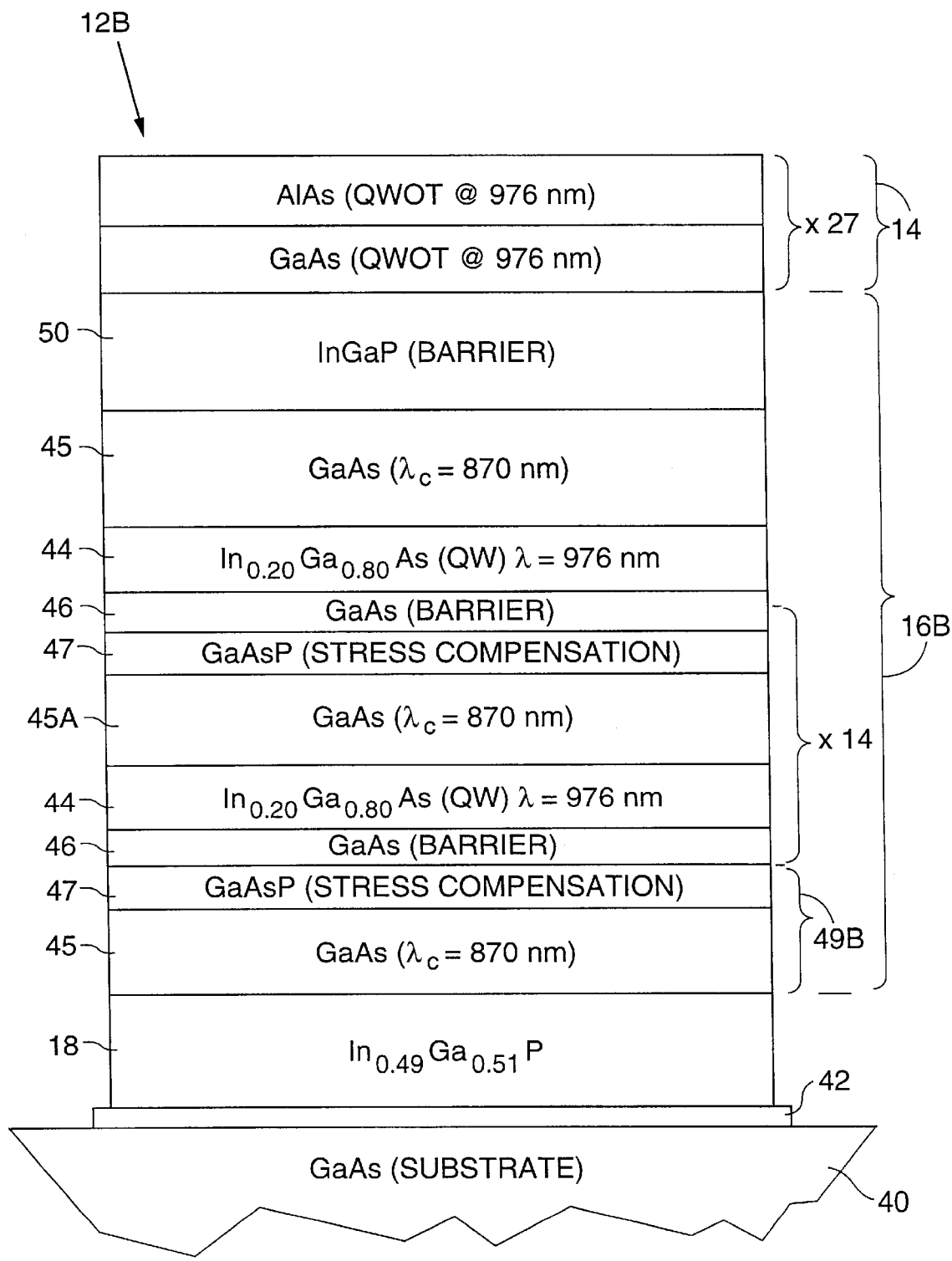
FIG. 3 is a general cross-section view illustrating details of another example of the mirror and quantum-well structures of FIG. 1.

While the InGaksP composition ($In_{0.08}Ga_{0.92}As_{0.82}P_{0.18}$) of spacer layer 48 can be readily grown by MBE, problems may be encountered in controlling stress in the layers if composition control is less than precise. This is because layer 48 is much thicker than the quantum-well layer 44, the stress-thickness product of which it must balance. Accordingly, the lattice mismatch of the layer must be relatively small (about 0.1%). A small difference in lattice mismatch due to a small composition variation, may be tolerable in the layer from the point of view of absorbing pump-radiation. Even such a small variation, however, can produce a relatively large percentage variations in stress, the effect of which is multiplied by the thickness of the layer. One structural variation for avoiding this problem is described below with reference to FIG. 3

Here, another preferred embodiment 12B of chip 12 of laser 10 is depicted. Chip 12B has a quantum-well structure 16B including an $In_{0.49}Ga_{0.51}P$ etch-stop/electrical-confinement layer having the same specification as layer 18 in chip 12A. An unstressed GaAs spacer layer 45A having a thickness of about 100 nm is then grown followed by a tensile stressed $GaAs_{0.9}P_{0.1}$ stress compensation layer 47 and a GaAs barrier layer 46. Next, fourteen groups of four layers are grown, each group including, in growth order: a quantum-well layer 44 of $In_{0.20}Ga_{0.80}As$, specified as for layer 44 of chip 12A and also being compressively stressed; an unstressed GaAs spacer layer 45A having a thickness of about 100 nm; a tensile stressed $GaAs_{0.9}P_{0.1}$ stress compensation layer 47; and an unstressed GaAs barrier layer 46.

As stress compensation layer 47 is of the same order of thickness as quantum-well layer 44, it has a significantly higher stress, such that its stress-thickness product can balance that of the quantum-well layer. The higher stress is much easier to control and reproduce than the low stress of spacer layer 48 of chip 12A. For comparison with chip 12A, layers 45 and 47 of chip 12B can be referred to as a "spacer group" of layers 49B. Spacer group 49A of 12A, of course, includes one only layer, i.e., layer 48. Quantum-well structure 16 is completed by quantum-well layer 44 of $In_{0.20}Ga_{0.80}As$, another GaAs spacer layer 45, and an InGaP barrier layer 50. Mirror 14 is then grown as described above for chip 12A. Thickness of layer 50 and the combined thickness of spacer layers and stress compensation layers is arranged as described above for chip 12, such that each quantum-well layer 44 is at an antinode of a standing-wave generated in the quantum-well structure when laser 10 is operational.

GaAs spacer layers 45 and 45A have a cut-on wavelength $\lambda_c$ of about 870 nm. This value of $\lambda_c$ allows for optimal absorption of pump-radiation having a wavelength between about 840 and 850 nm. An advantage of using pump-radiation in this wavelength range, instead of the 808 nm for which chip 12A is designed, is that the energy difference between the pump and lasing wavelengths is less. Accordingly, a larger portion of the pump energy is converted to laser-radiation. This provides for lower operating temperature for the same pump power and cooling arrangement.

External mirror 22 has a radius of curvature of 50 mm and cavity length L is about 43 mm. This produces a mode-spot size at output window layer 18 of about 150 $\mu$m diameter.

Pump-radiation source 26 is a 2 W, 808 nm diode-laser obtained from Coherent Inc. of Santa Clara, Calif. This laser has a 150 $\mu$m wide stripe and is focused (optics 28 of FIG. 1) by a graded index cylindrical lens and a graded index spherical lens. The graded index lenses are obtainable from Doric Lenses Inc. Using such a pump-radiation source arrangement it is possible to focus between 1.0 and 2.0 W of pump-radiation into the mode-spot size. Pump-radiation is incident at an angle a of forty-five degrees (45°).

A highest power output of about 590 mW is obtained when several spatial modes are allowed to oscillate. By adjusting mirror 22, the laser can be made to oscillate in the $TEM_{00}$ mode, albeit at a reduced maximum power output of about 470 mW.

The present invention has been described and depicted in terms of a preferred and other embodiments. The invention, however, is not restricted to the embodiments described and depicted. Rather, the invention is defined by the claims appended hereto.

What is claimed is:

1. A semiconductor laser, comprising:
    a first mirror;
    a semiconductor multilayer epitaxially-grown quantum-well structure on said first mirror, said quantum-well structure having an output-window layer defined as the epitaxially-grown layer furthest from said first mirror;
    said quantum-well structure including a plurality of quantum-well groups said quantum well groups superposed one on the other and each of said quantum-well groups having a compressively stressed quantum-well layer of InGaAs having a composition selected to emit laser radiation at a predetermined wavelength, a spacer layer group and a barrier layer of GaAs between said spacer layer group, said quantum-well layer, and the layer thicknesses in said quantum-well structure being selected such that each quantum-well layer therein is about at an antinode of a standing-wave generated in the structure when the laser is operational, with consecutive ones of said quantum-well layers optically spaced apart by about one-half of said laser-emission wavelength;

said spacer layer group including alternatively (a) a layer of $In_xGa_{(1-x)}As_yP_{(1-y)}$ having a tensile strain or (b) a layer of GaAs and a tensile stressed layer of $GaAs_uP_{(1-u)}$ where u is about 0.9;

a second mirror facing said output-window layer and spaced apart therefrom, thereby defining a gap between said second mirror and said output-window layer, said first and second mirrors defining a resonant cavity therebetween of length L; and at least one source of pump-radiation for optically pumping said quantum-well structure, said pump-radiation source arranged to direct said pump-radiation into said quantum-well structure via said output-window layer thereof.

2. The laser of claim 1, wherein said pump-radiation source is arranged to direct said pump-radiation into said quantum-well structure via said output-window layer thereof through said gap between said second mirror and said output-window layer without passing through said second mirror.

3. The laser of claim 1, wherein said epitaxially-grown quantum-well structure is grown by molecular beam epitaxy.

4. The laser of claim 3, wherein said quantum-well structure includes at least ten quantum-well groups.

5. The laser system of claim 3, wherein said quantum-well layers are layers of $In_xGa_{(1-x)}As$, where $0.0 \leq x < 0.3$.

6. The laser system of claim 5, wherein said spacer layer group is said single layer of $In_xGa_{(1-x)}As_yP_{(1-y)}$ having a composition selected to absorb said pump-radiation and a stress-thickness product selected to balance the stress-thickness product of said quantum-well layer.

7. The laser system of claim 5, wherein said spacer layer group includes said layers of GaAs and $GaAs_yP_{(1-y)}$ wherein said GaAs layer absorbs said pump-radiation and said layer of $GaAs_yP_{(1-y)}$ has a composition selected such that it has a stress-thickness product selected to balance to balance the stress-thickness product of said quantum-well layer.

8. A semiconductor laser, comprising:

a first mirror;

a semiconductor multilayer epitaxially-grown quantum-well structure on said first mirror, said quantum-well structure having an output-window layer defined as the epitaxially-grown layer furthest from said first mirror;

said quantum-well structure including a plurality of quantum-well groups, said quantum-well groups superposed one on the other and each of said quantum-well groups having a compressively stressed quantum-well layer of $In_zGa_{(1-z)}As$ where z is about 0.20 and is selected to provide laser emission at a wavelength of about 976 nm, a spacer layer group, and a barrier layer of GaAs between said spacer layer groups said quantum-well layer, and the said spacer layer group including a layer of $In_xGa_{(1-x)}As_yP_{(1-y)}$ where x is about 0.08 and y is about 0.82, and having a tensile stress, and with the layer thicknesses in said quantum-well structure being selected such that each quantum-well layer therein is about at an antinode of a standing-wave generated in the structure when the laser is operational, with consecutive ones of said quantum-well layers optically spaced apart by about one-half of said laser emission wavelength;

a second mirror facing said output-window layer and spaced apart therefrom, thereby defining a gap between said second mirror and said output-window layer, said first and second mirrors defining a resonant cavity therebetween of length L; and at least one source of pump-radiation for optically pumping said quantum-well structure, said pump-radiation source arranged to direct said pump-radiation into said quantum-well structure via said output-window layer thereof, and said pump-radiation having a wavelength of about 808 nanometers.

9. The laser of claim 8, wherein said pump-radiation source is arranged to direct said pump-radiation into said quantum-well structure via said output-window layer thereof through said gap between said second mirror and said output-window layer without passing through said second mirror.

10. The laser of claim 8, wherein said epitaxially-grown quantum-well structure is grown by molecular beam epitaxy.

11. The laser of claim 10, wherein said quantum-well structure includes at least ten quantum-well groups.

12. The laser of claim 10, wherein said quantum-well structure includes fifteen quantum-well groups.

13. A semiconductor laser, comprising:

a first mirror;

a semiconductor multilayer epitaxially-grown quantum-well structure on said first mirror, said quantum-well structure having an output-window layer defined as the epitaxially-grown layer furthest from said first mirror;

said quantum-well structure including a plurality of quantum-well groups said quantum-well groups superposed one on the other and each of said quantum-well groups having a compressively stressed quantum-well layer of $In_zGa_{(1-z)}As$ where z is about 0.20 and is selected to provide laser emission at a wavelength of about 976 nm, a spacer layer group and a barrier layer of GaAs between said spacer layer group and said quantum-well layer;

said spacer layer group including a layer of GaAs and a tensile stressed layer of $GaAs_yP_{(1-y)}$ where y is about 0.9, and with the layer thicknesses in said quantum-well structure being selected such that each quantum-well layer therein is about at an antinode of a standing-wave generated in the structure when the laser is operational, with consecutive ones of said quantum-well layers spaced apart by about one-half of said laser emission wavelength;

a second mirror facing said output-window layer and spaced apart therefrom, thereby defining a gap between said second mirror and said output-window layer, said first and second mirrors defining a resonant cavity therebetween of length L; and at least one source of pump-radiation for optically pumping said quantum-well structure, said pump-radiation source arranged to direct said pump-radiation into said quantum-well structure via said output-window layer thereof.

* * * * *